United States Patent
Boyle et al.

(10) Patent No.: US 9,225,065 B2
(45) Date of Patent: Dec. 29, 2015

(54) ADAPTIVE ANTENNA MODULE

(75) Inventors: Kevin R. Boyle, Horsham (GB);
Maurice de Jongh, Nijmegen (NL);
Adrianus van Bezooijen, Molenhoek (NL)

(73) Assignee: Qualcomm Technologies, Inc., San Diego, CA (US)

( * ) Notice: Subject to any disclaimer, the term of this patent is extended or adjusted under 35 U.S.C. 154(b) by 572 days.

(21) Appl. No.: 13/695,396

(22) PCT Filed: Apr. 30, 2010

(86) PCT No.: PCT/EP2010/055932
§ 371 (c)(1),
(2), (4) Date: Jan. 17, 2013

(87) PCT Pub. No.: WO2011/134534
PCT Pub. Date: Nov. 3, 2011

(65) Prior Publication Data
US 2013/0113677 A1 May 9, 2013

(51) Int. Cl.
*H01Q 1/50* (2006.01)
*H03H 7/40* (2006.01)
*H01Q 9/04* (2006.01)

(52) U.S. Cl.
CPC ............. *H01Q 9/0442* (2013.01); *H03H 7/40* (2013.01)

(58) Field of Classification Search
CPC ..................... H03H 7/40; H01Q 9/0442
USPC ........................................ 343/860
See application file for complete search history.

(56) References Cited

U.S. PATENT DOCUMENTS

| | | |
|---|---|---|
| 5,778,308 A | 7/1998 | Sroka et al. |
| 2004/0263411 A1 | 12/2004 | Fabrega-Sanchez et al. |
| 2005/0024288 A1 | 2/2005 | Saito |
| 2005/0093624 A1* | 5/2005 | Forrester et al. ............... 330/129 |
| 2005/0212604 A1* | 9/2005 | Cyr et al. .................... 331/16 |
| 2005/0245204 A1 | 11/2005 | Vance |
| 2010/0073103 A1 | 3/2010 | Spears et al. |
| 2010/0182216 A1* | 7/2010 | Schmidhammer ............ 343/861 |

FOREIGN PATENT DOCUMENTS

| | | |
|---|---|---|
| DE | 695 31 804 T2 | 7/2004 |
| EP | 0 685 936 A2 | 12/1995 |
| JP | H0935942 A | 2/1997 |
| JP | 2005051503 A | 2/2005 |
| JP | 2005354502 A | 12/2005 |
| JP | 2006324984 A | 11/2006 |

(Continued)

OTHER PUBLICATIONS

International Search Report—PCT/EP2010/055932—ISA/EPO—Feb. 3, 2011.

(Continued)

*Primary Examiner* — Sue A Purvis
*Assistant Examiner* — Michael Bouizza
(74) *Attorney, Agent, or Firm* — Smith Risley Tempel Santos LLC

(57) ABSTRACT

A cheaper to produce, smaller and easy to drive adaptive antenna module is presented. The module comprises a signal path, an antenna, and a tuning circuit with two variable impedance elements. The tuning circuit operates over a restricted range of impedances and maintains the series resonance characteristic of the antenna.

16 Claims, 3 Drawing Sheets

(56) References Cited

FOREIGN PATENT DOCUMENTS

| | | |
|---|---|---|
| JP | 2007312230 A | 11/2007 |
| JP | 2008507942 A | 3/2008 |
| JP | 2008147929 A | 6/2008 |
| JP | 2008300933 A | 12/2008 |
| WO | 2006014795 A1 | 2/2006 |

OTHER PUBLICATIONS

Boyle, K., et al., "Radiating and Balanced Mode Analysis of PIFA Antennas," IEEE Transactions on Antennas and Propagation, vol. 54, No. 1, Jan. 2006, pp. 231-237.

* cited by examiner

824 MHz – 960 MHz

824 MHz – 960 MHz

ADAPTIVE ANTENNA MODULE

This patent application is a national phase filing under section 371 of PCT/EP2010/055932, filed Apr. 30, 2010, which is incorporated herein by reference in its entirety.

TECHNICAL FIELD

The present invention relates to adaptive antenna modules, especially to adaptive antenna modules that can be used in mobile communication devices.

BACKGROUND

The antennas of mobile communication devices are typically designed to have a VSWR (Voltage Standing Wave Ratio) of 3 or less in free space. The VSWR is a measure for the reflected RF energy. Environmental influences, e.g., a user's hand or a user's head in the vicinity of the mobile device, in general cause a degradation of the antenna performance, i.e., an increase of the VSWR. Adaptive antenna modules shall counteract this degradation and maintain or regain a low VSWR.

From the European patent application EP 0685936 A2, an adaptive antenna matching circuit is known. The circuit comprises a matching network and a coupler, both being electrically connected to a signal path. The circuit further comprises a processor that is electrically connected to the matching network and to the coupler. The matching network comprises tunable reactance elements which are electrically connected in series to the signal path or which electrically connect the signal path with ground. The process of matching the impedance of the signal path comprises several steps of tuning single variable reactance elements individually and on after another and storing preferred settings within a memory. Thus, the process of matching the impedance is complicated, power consuming and demands for a complex and costly processor circuit.

SUMMARY OF THE INVENTION

In one aspect, the present invention provides a low cost adaptive antenna module that has a small size and an improved performance. In another aspect, the invention provides an adaptive antenna module that is drivable by a simple, fast and stable algorithm.

The invention comprises a signal path, an antenna and a tuning circuit. The antenna is electrically connected to the signal path and shows a series resonant behavior at a resonance frequency $f_0$. The tuning circuit is electrically connected to the signal path and minimizes the VSWR in the signal path. The tuning circuit comprises two variable impedance elements. The two variable impedance elements comprise a variable series impedance element being electrically connected in series within the signal path and a variable shunt impedance element being electrically connected in series within a first parallel path. The first parallel path electrically connects the signal path with ground. The tuning circuit operates over a restricted range of impedances being defined by the possible values of the variable impedance elements. The tuning circuit maintains the series resonant characteristic of the antenna.

The inventors found that an antenna that maintains its series resonant characteristic is easier to handle than respective antennas with a resonant behavior being different than a series resonant behavior or even with varying characteristics. The wording "series resonant characteristics" denotes the frequency dependent characteristics of a circuit in which a resistance element, a capacitance element and an inductance element are electrically connected in series.

Tuning algorithms in general have to consider the working frequency, the imaginary part and the reactive part of the actual impedance, details of the tuning circuit, the power level of the mobile device's battery and further parameters. The present invention, however, proposes a circuit which, e.g., can be driven by measuring the phase of an impedance Z of an impedance element, e.g., an inductance element within the signal path and just looking at the respective entry of a one-dimensional lookup table. The respective phase is measured by measuring the voltage across the impedance element or by measuring the voltage transfer characteristic across the impedance element. Such a circuit is advantageous because it allows a fast finding of the settings of the variable impedance elements required to make a good impedance matching.

Thus, the above module provides a low cost adaptive antenna module that has a small size and an improved performance. The module is drivable by a simple, fast and stable algorithm.

In one embodiment, the adaptive antenna module further comprises a logic circuit and a lookup table which is implemented in the logic circuit for setting the values of the variable impedance elements.

It is possible to create a lookup table and store the lookup table within the logic circuit where the lookup table provides settings for an optimal value of the variable series impedance element and an optimal value of the variable shunt impedance element. During operation, the optimal setting of the adaptive antenna module can be found in a one-dimensional lookup table which yields a fast algorithm.

In one embodiment, the variable series impedance element and the variable shunt impedance element are impedance elements with variable capacitances. Examples for impedance elements with variable capacitances are switched capacitor arrays or varactors.

In one embodiment, an adaptive antenna module further comprises a first inductance element that electrically connects the signal path with ground. An inductance element that electrically connects the signal path with ground can work as an ESD protection element, especially if it is electrically connected to the antenna.

In one embodiment, an adaptive antenna module further comprises a capacitance element that electrically connects the antenna with ground. Such a capacitance element can help to maintain the series resonant characteristic of the antenna. It can, for example, eliminate an inductive component of the impedance of the antenna.

In one embodiment, an adaptive antenna module further comprises a second inductance element that electrically connects the signal path with ground. Such a second inductance element can help to compensate or even eliminate parasitic capacitances of a transmission line that is electrically connected between the tuning circuit and the antenna.

In one embodiment, the antenna module further comprises a third inductance element and a first switch. The third inductance element is electrically connected in series within the signal path. The first switch is electrically connected in series within the signal path and in parallel to the third inductance element. Such a parallel circuit of an inductance element and a switch can increase the tuning range of the tuning circuit.

In one embodiment, the antenna module further comprises a fourth inductance element that is electrically connected in series within the signal path. Such a fourth inductance element within the signal path can be utilized to measure the actual impedance matching. For example, the change in phase of the impedance Z of an impedance element or the voltage transfer characteristic that is caused by the impedance element, e.g., by an inductance element, can be measured.

In one embodiment, the adaptive antenna module further comprises a double-tuning circuit having a second parallel path electrically connecting the signal path with ground. The double-tuning circuit comprises a parallel resonance circuit which has a fifth inductance element electrically connected within the second parallel path and a variable capacitance element electrically connected in parallel to the fifth inductance element. The double-tuning circuit further comprises a second switch that is electrically connected in series within the second parallel path between the signal path and the parallel resonant circuit.

Such a double-tuning circuit may be used to improve the simultaneous $T_x/R_x$ performance when the quality factor of the antenna Q is high. During simultaneous $T_x$ and $R_x$ operation, the impedance match has to be fulfilled for the transmitting frequency range and the receiving frequency range at the same time. Thus, the range of frequencies in which a good impedance match is necessary, is enhanced. For example, the double-tuning circuit provides a means for widening the matchable frequency range especially when the antenna has a high quality factor Q.

The double-tuning circuit can be electrically connected to the signal path by the second switch if simultaneous $T_x$ and $R_x$ operation is required, e.g., during WCDMA operation. Information that is relevant for deciding whether the double tuning circuit should be activated can be derived from the relationship between the setting of the variable impedance elements, e.g., capacitive elements, and the detected quality factor Q of the antenna.

In one embodiment, the antenna is selected from a PIFA (PIFA=Planar Inverted F-Antenna), a PILA (PILA=Planar Inverted L-Antenna), and a monopole antenna and variants of such antennas.

In one embodiment, the antenna module further comprises a detector that is electrically connected to the signal path. The detector is used for detecting the impedance match of the adaptive antenna module where the setting of the values of the variable impedance elements depends on a signal generated from the detector and a lookup table, the lookup-table being implemented in a logic circuit.

In one embodiment of the antenna module, the detector comprises a phase detector that is electrically connected in parallel to the fourth inductance element.

In one embodiment, the adaptive antenna module is usable in GSM-, CDMA-, or WCDMA-systems.

Thus, the present invention provides a good adaptive impedance matching for both, FDD (Frequency Division Duplexing) and TDD (Time Division Duplexing) transmission modes.

It is possible that the antenna has a series resonant characteristic. The antenna characteristic may be rotated in the smith chart and the matching topology may shift the rotation back.

The tuning circuit may comprise any component that maintains or restores the antenna's series resonant characteristic.

The variable impedance elements may be ganged together in such a way that an algorithm can benefit from simple, robust one-dimensional control and detection.

The ganged elements' settings are based on the characteristics of the antenna in such a way to ensure one dimensional control and detection.

An lookup-table may be regarded as a part of the algorithm.

In one embodiment, the antenna module can perform impedance matching. The process of matching includes the steps. The voltage of an RF-signal propagating within the signal path is detected. The detected phase is compared with phase-values stored in a lookup table and the entry in the lookup table that matches the detected phase is found. The values of the variable impedance elements are set according to values of the lookup table associated with the detected phase.

The following additional steps can be included. The phase of the impedance Z of an impedance element that is electrically connected within the signal path can be calculated and the difference between a desired value of the phase of an impedance Z according to the lookup-table and the detected phase of the impedance Z can be minimized.

BRIEF DESCRIPTION OF THE DRAWINGS

The present invention will become fully understood from the detailed description given herein below and the accompanying drawings. In the drawings.

DETAILED DESCRIPTION OF ILLUSTRATIVE EMBODIMENTS

Figure 1:
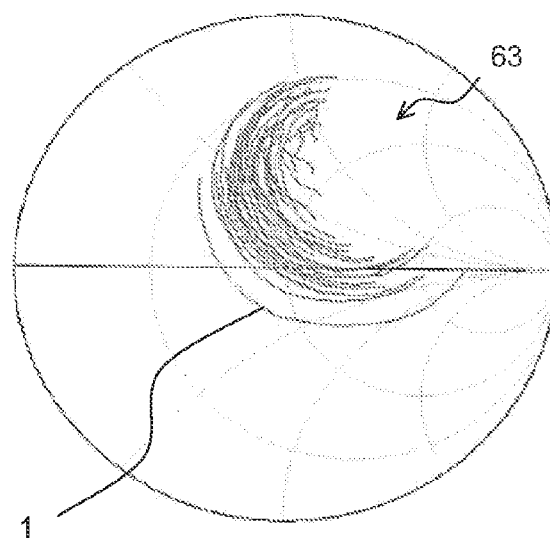
FIG. 1 shows a Smith chart illustrating the frequency-dependent impedance of one antenna "in free space" and the simulated results of the frequency-dependent impedance of an antenna with 63 different environmental conditions.

FIG. 1 illustrates 64 different frequency-dependent impedance curves of a not-matched antenna of a mobile communication device in a Smith chart. One curve, denoted by "1," shows the frequency behavior of a single, free-standing antenna. The other 63 curves represent the frequency-dependent impedance of the antenna where the environment in the vicinity of the antenna is individually different. As a result of different environmental conditions, the antenna impedance varies significantly.

Figure 2:
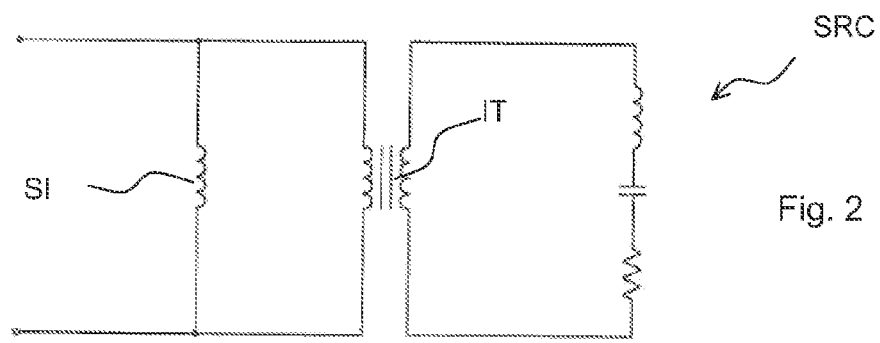
FIG. 2 illustrates an equivalent circuit diagram of an antenna.

FIG. 2 illustrates an equivalent circuit diagram of a real antenna. The circuit comprises a shunt inductance element SI, an impedance transformer IT, and a series resonant circuit SRC comprising an inductance element, a capacitance element and a resistance element, each being electrically connected in series.

Figure 3:
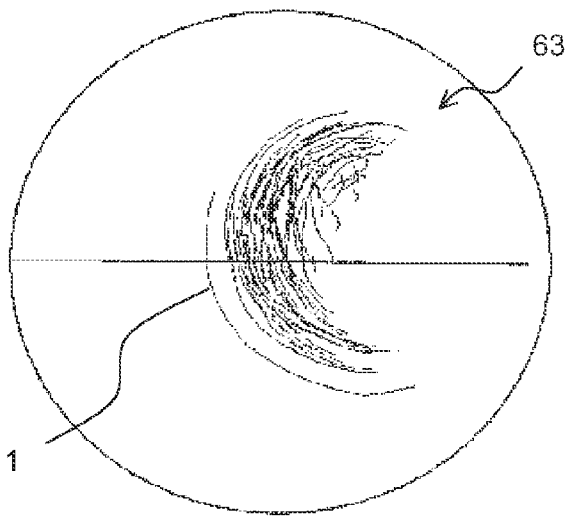
FIG. 3 illustrates the frequency-dependent impedance curves of FIG. 1, however: the antenna is provided with a series resonant characteristic.

FIG. 3 illustrates the frequency-dependent impedance curves of FIG. 1 where the antenna is driven to maintain a series resonant characteristic. In FIG. 2, the shunt impedance element SI disturbs the series resonant characteristic of the antenna. In order to avoid the existence of the shunt impedance element of FIG. 2, measures have to be taken to reach the easy to predict impedance behavior shown in FIG. 3. As can be seen in FIG. 3, mainly the imaginary part of the impedance varies when the frequency is varied. The impedance situation in FIG. 3 can be handled, in contrast to the situation in FIG. 1, by a simple, stable and fast algorithm for driving the variable impedance elements of the tuning circuit.

Means for eliminating the shunt inductance element of a real antenna could be a transmission line, e.g., a 20° transmission line between the tuning circuit and the antenna. However, implementing a slot, especially of length λ/4, within the antenna or a PCB (PCB=printed circuit board) supporting the antenna or a shunt capacitance can be used to annihilate or to decrease the effect of the shunt inductance element.

Figure 4:
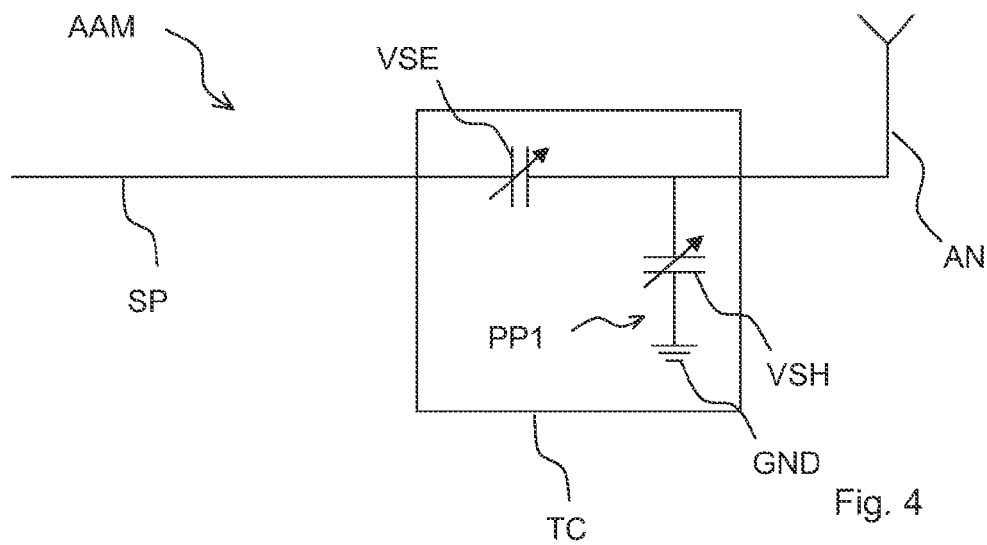
FIG. 4 illustrates a basic version of the adaptive antenna module.

FIG. 4 shows the basic version of an antenna of an adaptive antenna module AAM according to the invention. The antenna module comprises an antenna AN that is electrically connected to a signal path SP. The adaptive antenna module AAM comprises a tuning circuit TC which has a variable series impedance element VSE that is electrically connected in series within the signal path SP. The tuning circuit TC further has a variable shunt impedance element VSH that is electrically connected within a first parallel path PP1 between the signal path SP and ground GND.

Figure 5:
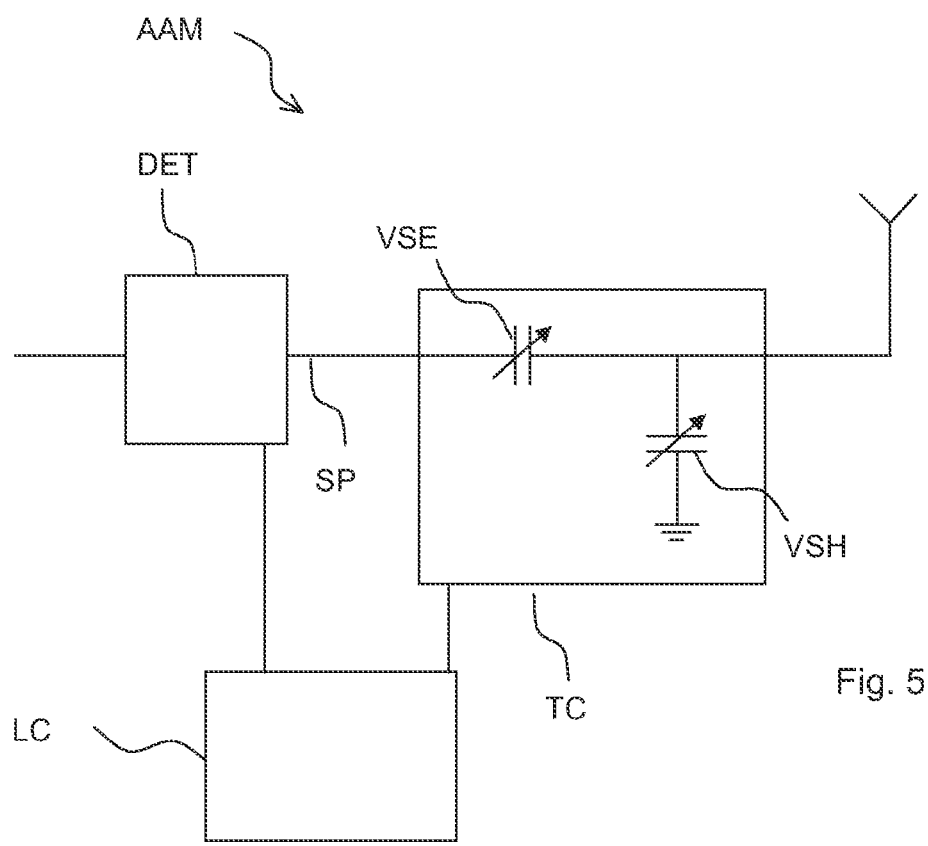
FIG. 5 illustrates an embodiment of the antenna module having a detector and a logic circuit.

FIG. 5 illustrates an embodiment of the adaptive antenna module AAM which comprises a detector circuit DET that is electrically connected within the signal path SP. The module AAM further comprises a logic circuit LC that is electrically connected to the tuning circuit TC and to the detector DET. The detector DET transmits a signal to the logic circuit LC in which the actual impedance matching is encoded. The logic circuit LC considers the actual impedance matching and determines values and sets the values of the variable impedance elements of the tuning circuit. Thus, a control loop for controlling the impedance matching is gained.

Figure 6:
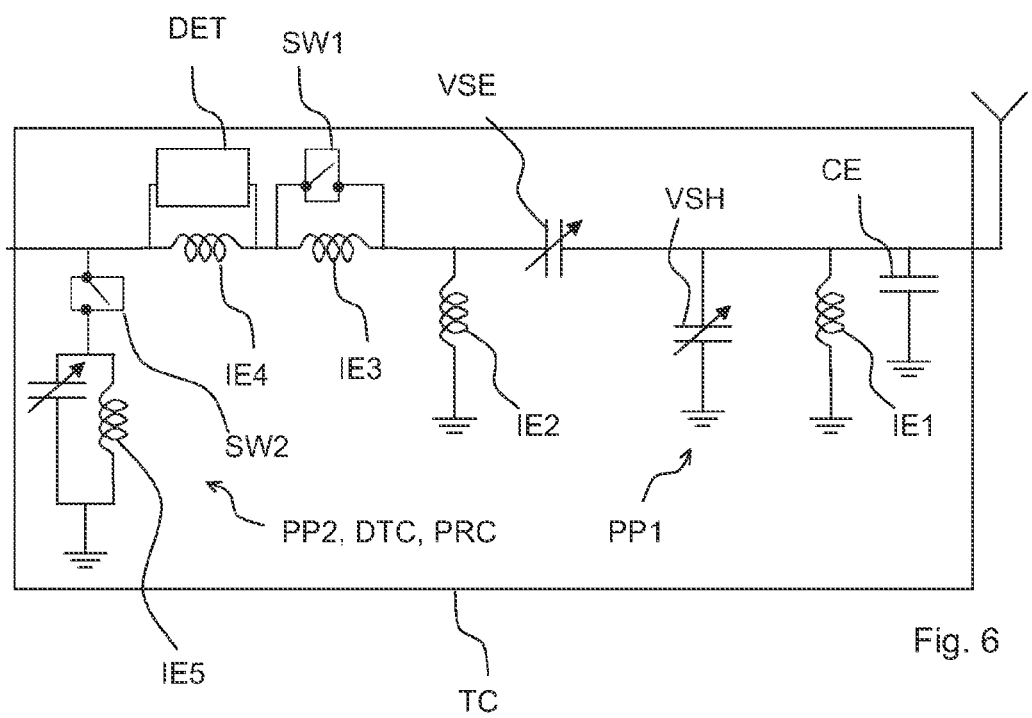
FIG. 6 illustrates a schematic diagram of the antenna module having further circuit elements.

FIG. 6 shows an embodiment of the adaptive antenna module having a capacitance element CE that is electrically connected to the signal path and to the antenna on one side and to ground on the other side. Further, a first inductance element IE1 electrically connects the signal path with ground. The variable shunt inductance element VSH electrically connects the signal path with ground and the variable series impedance element VSI is electrically connected in series within the signal path. Further, a second inductance element IE2 electrically connects the signal path with ground. A third inductance element IE3 is electrically connected in series within the signal path. A first switch SW1 is electrically connected in parallel to the third inductance element IE3. By the first switch SW1, the third inductance element IE3 can be coupled to or from the signal path. As a further inductance element a fourth inductance element IE4 is electrically connected in series within the signal path. A detector DET is electrically connected in parallel to the fourth inductance element IE4. The detector DET comprises a circuit for measuring the voltage or the voltage transfer function of the fourth inductance element IE4. Such a measured voltage or voltage transfer function is a possible basis for calculating the impedance match.

The first inductance element IE1 establishes a parallel path that is electrically connected in parallel to the signal path SP between the signal path SP and ground.

Within a second parallel path PP2, a second switch SW2 and a double-tuning circuit DTC are electrically connected in series. The second parallel path PP2 is electrically connected in parallel to the signal path and electrically connects the signal path with ground. The double-tuning circuit DTC comprises a parallel resonant circuit having an inductance element IE5 and a capacitance element of a variable capacitance.

Series resonant antennas exhibit several characteristics that may be utilized in order to improve the algorithms used to achieve a good matching. In particular, the compromise that exists between the transmit ($T_x$) and receive ($R_x$) frequencies may be addressed by using knowledge of how typical series resonant antennas perform.

Sensing the mismatch, e.g., by the detector DET, in general is performed during the transmission time period when enough power is available to drive the detector. Impedance matching for $R_x$ frequencies may be associated with the $T_x$ matching. For series resonant antennas, this is relatively simple to do since the difference between the $T_x$ and $R_x$ impedances is predominantly reactive. But the difference depends on user interaction. The amount of user interaction is obtained by the solution found by the tuning algorithm.

Typical series resonant antennas exhibit some clear trends concerning the association of $T_x$ and $R_x$ matching: the variation of the quality factor of the antenna with frequency depends primarily on the size of the antenna and the size of an according mobile communication device. For example, the quality factor Q decreases with frequency in both of the commonly used frequency ranges between 824 and 960 MHz and between 1710 and 2170 MHz. Then, the tuning circuit has to comprise a tunable reactance element connected in series with the antenna. The required offset between the $T_x$ and $R_x$ reduces as the matching reactance of the antenna becomes more capacitive.

Similarly, as user interaction with the antenna becomes more severe, the impedance becomes increasingly inductive and the antenna Q generally reduces. Hence, for any chosen frequency, as the required matching reactance becomes more capacitive, the required offset between the $T_x$ and $R_x$ reduces.

In CDMA mode, the $T_x$ and the $R_x$ frequencies must be simultaneously matched. The separation of the impedances at $T_x$ and $R_x$ frequencies depends on the quality factor of the antenna and user interaction. To match the impedances at both frequencies, a RF dependent circuit should be used to bring the impedances associated with the $T_x$ and $R_x$ frequencies to the same value. For a series resonant antenna, a double-tuning circuit DTC, consisting of a parallel inductor and a capacitor, can be used to achieve good matching. Then, the $T_x$ and $R_x$ impedances should have approximately the same conductance and opposite susceptances.

However, even without a double-tuning circuit $T_x$ and $R_x$ frequencies can be matched simultaneously. Then, the $T_x$ impedance should be adapted to a negative reactance in order to ensure that the $R_x$ reactance is not too high. To do this, a reactance detector is required.

A good matching and a fast and stable algorithm can be achieved with the below lookup table as one out of many examples in combination with the circuit of FIG. 6. The below table is only one possible example. The entries of the table may depend on the frequency. It is possible that there may be a different lookup-table for each different frequency band.

| Index | SW1 | VSE | Phase | SW1/$R_X$ | VSE/$R_X$ |
|---|---|---|---|---|---|
| 0 | 0 | 0 | −5 | 0 | 0 |
| 1 | 0 | 1 | −5 | 0 | 0 |
| 2 | 0 | 2 | −6 | 0 | 1 |
| 3 | 0 | 3 | −6 | 0 | 2 |
| 4 | 0 | 4 | −7 | 0 | 3 |
| 5 | 0 | 6 | −7 | 0 | 4 |
| 6 | 0 | 9 | −8 | 0 | 6 |
| 7 | 0 | 15 | −9 | 0 | 9 |
| 8 | 0 | 31 | −10 | 0 | 9 |
| 9 | 1 | 10 | −10 | 0 | 15 |
| 10 | 1 | 15 | −15 | 0 | 31 |
| 11 | 1 | 31 | −20 | 1 | 10 |

It is possible to allow only a certain number of possible combinations. Limiting the number of possible combinations may lead to a drastically reduced number of combinations making the algorithm faster and more stable. Then, "Index" is the number used for each of the allowed combinations. "SW1" is the state of the first switch SW1 in the $T_x$-mode. "VSE" is the capacitance of the variable series inductance element VSE in the $T_x$-mode. It is assumed, then, that the capacitance is a 5-bit switched device with 32 states. State 0 is the lowest capacitance state, whereas state 31 is the highest capacitance state. "Phase" is the phase value delivered from the detector. (SW1/$R_x$) is the state of the switch in the $R_x$-mode. "VSE/$R_x$" is the capacitance state in the $R_x$-mode.

As one can see, a tuning algorithm has only to consider this one dimensional lookup table in order to perform a simple, fast and stable matching for the adaptive antenna matching.

A possibility to further increase the stability of a matching algorithm may be to limit the capacitance states in order to prevent dual solutions. Further, reducing the number of possible combinations to allowed combinations may prevent over-voltage or non-linearity or phase errors of the circuit.

The phase target may become more negative as the index increases since the quality factor of the antenna also increases. This yields a better compromise between $T_x$ and $R_x$ impedances.

As already stated, double-tuning may only be required when the quality factor of the antenna Q is high. This corresponds to a high index value in the lookup table. Hence, double-tuning can be switched on when the index is above a predetermined value. The phase targets for these values can also be chosen to be appropriate for double-tuning.

The invention is not restricted by the embodiments or the accompanied figures. Especially embodiments having further impedance elements or variable impedance elements, signal paths or resonant circuits are also possible. Thus, numerous variations departing from the figures are possible without departing from the invention.

The invention claimed is:

1. An adaptive antenna module comprising:
   a signal path;
   a series resonant antenna that is electrically connected to the signal path;
   a detector electrically connected to the signal path for detecting impedance matching of the adaptive antenna module, the detector configured to generate a signal representing a detected phase of a radio frequency (RF) signal propagating in the signal path;
   a tuning circuit comprising two variable impedance elements, the variable impedance elements comprising a variable series impedance element that is electrically connected in series within the signal path and a variable shunt impedance element that is electrically connected in series within a first parallel path electrically connecting the signal path with ground, each variable impedance element having an impedance value responsive to an impedance setting associated with the variable impedance element;
   wherein the tuning circuit comprises logic configured to:
   compare the signal representing the detected phase with phase values stored in a lookup table, each phase value stored in the lookup table corresponding to an entry stored in the lookup table; and
   set the impedance setting associated with each of the variable impedance elements in response to an entry in the lookup table corresponding to a phase value matching the detected phase;
   wherein the tuning circuit is constrained by the entries stored in the lookup table to operate over a restricted range of impedances defined by the possible impedance values of the variable impedance elements.

2. The adaptive antenna module of claim 1, wherein the variable series impedance element and the variable shunt impedance element are impedance elements with variable capacitances.

3. The adaptive antenna module of claim 1, further comprising a first inductance element electrically connecting the signal path with ground.

4. The adaptive antenna module of claim 1, further comprising a capacitance element electrically connecting the antenna with ground.

5. The adaptive antenna module of claim 1, further comprising a second inductance element electrically connecting the signal path with ground.

6. The adaptive antenna module of claim 1, further comprising
   a third inductance element electrically connected in series within the signal path, and
   a first switch electrically connected in series within the signal path and in parallel to the third inductance element.

7. The adaptive antenna module of claim 1, further comprising a fourth inductance element electrically connected in series within the signal path.

8. The adaptive antenna module of claim 7, further comprising a double-tuning circuit having
   a second parallel path electrically connecting the signal path with ground;
   a parallel resonant circuit having a fifth inductance element electrically connected within the second parallel path and a variable capacitance element electrically connected in parallel to the fourth inductance element; and
   a second switch electrically connected in series within the second parallel path between the signal path and the parallel resonant circuit.

9. The adaptive antenna module of claim 1, wherein the antenna comprises an antenna selected from the group consisting of a PIFA, a PILA, and a rod antenna.

10. The adaptive antenna module of claim 1, further comprising a fourth inductance element electrically connected in series within the signal path and wherein the detector comprises a phase detector that is electrically connected in parallel to the fourth inductance element.

11. The adaptive antenna module of claim 1, wherein the adaptive antenna module is usable in GSM-, CDMA-, or WCDMA-systems.

12. An adaptive antenna module comprising:
    a signal path;
    an antenna node electrically connected to the signal path and configured to be coupled to an antenna;
    a variable series impedance element electrically connected in series within the signal path;
    a variable shunt impedance element electrically connected between the signal path and a ground node;
    a first inductance element electrically connected between the signal path and the ground node;
    a second inductance element electrically connected between the signal path and the ground node;
    a third inductance element electrically connected in series within the signal path;
    a first switch electrically connected in parallel with the third inductance element;
    a fourth inductance element electrically connected in series within the signal path;
    a parallel resonant circuit electrically connected between the signal path and the ground node, the parallel resonant circuit comprising a fifth inductance element electrically connected in parallel with a variable capacitance element; and
    a second switch electrically connected between the signal path and the parallel resonant circuit.

13. The adaptive antenna module of claim 12, further comprising a detector electrically connected in parallel with the fourth inductance element.

14. The adaptive antenna module of claim 12, wherein:
the fourth inductance element is coupled between the second switch and the third inductance element;
the third inductance element is coupled between the fourth inductance element and the variable series impedance element;
the variable series impedance element is coupled between the third inductance element and the antenna node;
the second inductance element is coupled to the signal path at a location between the third inductance element and the variable series impedance element; and
the first inductance element is coupled to the signal path at a location between the variable series impedance element and the antenna node.

15. The adaptive antenna module of claim 12, further comprising an antenna electrically connected to the antenna node.

16. The adaptive antenna module of claim 15,
wherein the antenna is series resonant;
wherein a tuning circuit is formed by the variable series impedance element and the variable shunt impedance element; and
wherein the tuning circuit operates over a restricted range of impedances that is defined by the possible values of the variable impedance elements.

* * * * *